(12) United States Patent
Nuebling et al.

(10) Patent No.: US 12,014,981 B2
(45) Date of Patent: Jun. 18, 2024

(54) ACTIVE UNDER SHIELDING FOR COILS AND TRANSFORMERS

(71) Applicant: Infineon Technologies AG, Neubiberg (DE)

(72) Inventors: Marcus Nuebling, Olching-Esting (DE); Mathias Racki, Hilgertshausen-Tandern (DE)

(73) Assignee: Infineon Technologies AG, Neubiberg (DE)

( * ) Notice: Subject to any disclaimer, the term of this patent is extended or adjusted under 35 U.S.C. 154(b) by 79 days.

(21) Appl. No.: 17/662,790

(22) Filed: May 10, 2022

(65) Prior Publication Data

US 2023/0369204 A1    Nov. 16, 2023

(51) Int. Cl.
*H01L 23/522* (2006.01)
*H01L 27/06* (2006.01)
*H01L 49/02* (2006.01)

(52) U.S. Cl.
CPC ...... *H01L 23/5227* (2013.01); *H01L 23/5225* (2013.01); *H01L 27/0629* (2013.01); *H01L 28/10* (2013.01)

(58) Field of Classification Search
CPC . H01L 23/5227; H01L 28/10; H01L 27/0629; H01L 23/5225; H01L 28/40; H01L 28/20
USPC .......................................... 257/531; 438/957
See application file for complete search history.

(56) References Cited

U.S. PATENT DOCUMENTS

2021/0242840 A1\* 8/2021 Shilimkar et al.

OTHER PUBLICATIONS

"Quality Factor / Q Factor; formulas and equations", Electronics Notes, Retrieved from: https://www.electronics-notes.com/articles/basic_concepts/q-quality-factor/basics-tutorial-formula.php, Accessed on Mar. 10, 2022, 4 pages.
Burghartz et al., "On the Design of RF Spiral Inductors on Silicon", IEEE, vol. 50, Issue 3, Mar. 2003, pp. 718-729.
Jimblom, "Capacitors", Retrieved from https://learn.sparkfun.com/tutorials/capacitors/application-examples, Accessed on Mar. 10, 2022, 5 pages.
Niknejad, "Passive Devices for Communication Integrated Circuits", U.C. Berkeley, Retrieved from: http://rfic.eecs.berkeley.edu/ee242/pdf/Module_1_3_Passives.pdf, Access on Mar. 10, 2020, 100 pages.
Yue et al., "On-Chip Spiral Inductors with Patterned Ground Shields for Si-Based RF IC's", IEEE, vol. 33, No. 5, May 1998, pp. 743-752.

\* cited by examiner

*Primary Examiner* — Thinh T Nguyen
(74) *Attorney, Agent, or Firm* — Shumaker & Sieffert, P.A.

(57) ABSTRACT

An example circuit includes a coil structure located on at least a first layer of an integrated circuit (IC); and a circuit component comprising conduction paths. The conduction paths are located on one or more layers separate from the first layer and the first layer and the one or more layers form parallel planes. The conduction paths of the circuit component are oriented to avoid eddy currents in the conduction paths caused by an electric current through the coil structure and form a patterned shield. At least some of the conduction paths define an area, and the coil structure is located within the defined area.

15 Claims, 7 Drawing Sheets

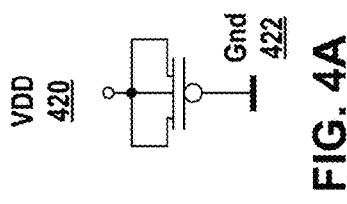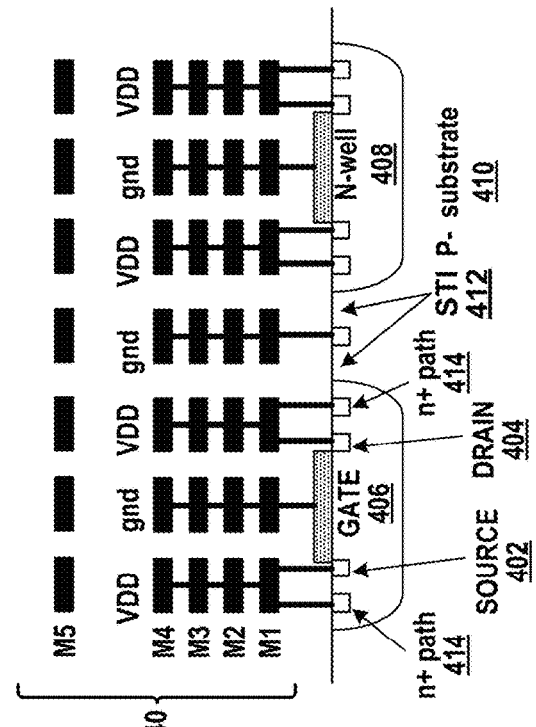

ACTIVE UNDER SHIELDING FOR COILS AND TRANSFORMERS

TECHNICAL FIELD

The disclosure relates to shielding for inductive circuitry, such as integrated circuits with inductors, coils, or transformers.

BACKGROUND

Inductive circuitry, such as coils and transformers generate an electromagnetic field. The electric field and the magnetic field can couple to other layers of the circuit and cause undesired behavior in the circuitry, as well as reduce performance for the inductive circuitry. For inductive circuitry implemented on an integrated circuit, the electric field may couple to the substrate. Placing a planar metal layer under the coil may shield both the electric and magnetic field but will reduce or eliminate the inductance of the coil structure and result in eddy currents in the metal layer.

SUMMARY

In general, the disclosure describes techniques to implement active or passive circuitry under a coil such that every conduction layer of the circuitry under the coil follows the shape of a patterned shield. In some examples, the active or passive circuitry may act as the patterned shield. In other examples, the active or passive circuitry may comprise one or more conduction layers co-located with a patterned shield and have the same or similar shape to the patterned shield. In either example, the metal strips or conduction layers of the active or passive circuitry, and/or the shield, are configured such that the metal strips cross at right angles to the conductors in the coil structure.

In the example of an integrated circuit (IC), the active or passive circuitry patterned as a shield may be located under the coil structure, thereby opening space available on the IC to either add additional circuitry on the same die size, or to reduce the size of the die. For example, a buffer capacitor, which may be connected between power supply rails for ripple suppression or to stabilize power supplied to the IC, may consume a significant volume of the IC. A buffer capacitor may be implemented as conductive strips, e.g., on multiple layers, where the conductive strips conform to the same shape as a patterned shield, which are perpendicular, or approximately perpendicular, to the conductors in the coil structure. A buffer capacitor may also be referred to as a bypass capacitor in this disclosure.

In one example, this disclosure describes a circuit comprising a coil structure located on at least a first layer of an integrated circuit (IC); and a circuit component comprising conduction paths, wherein the conduction paths are located on one or more layers separate from the first layer, the first layer and the one or more layers form parallel planes, the conduction paths of the circuit component are oriented to avoid eddy currents in the conduction paths caused by an electric current through the coil structure, at least some of the conduction paths define an area, and the coil structure is located within the defined area.

In another example, this disclosure describes a method comprising forming a coil structure on a first layer of an integrated circuit (IC), wherein the coil structure is configured to carry electrical current; forming a circuit component comprising conduction paths on one or more layers separate from the first layer, wherein: the first layer and the one or more layers form parallel planes, the conduction paths of the circuit component are oriented to avoid eddy currents in the conduction paths caused by an electric current through the coil structure, at least some of the conduction paths define an area, and the coil structure is located within the defined area.

In another example, this disclosure describes a circuit comprising a coil structure located on at least a first layer of an integrated circuit (IC); a patterned shield located on a second layer separate from the first layer, wherein the first layer and the second layer form parallel planes, the patterned shield comprises a plurality of first conduction paths oriented to avoid eddy currents caused by electric current through the coil structure, the plurality of first conduction paths defines a first area, and a circuit component comprising a plurality of second conduction paths, wherein: the plurality of second conduction paths are located on one or more component layers separate from the first layer and separate from the second layer and are electrically isolated from the patterned shield, the first layer, the second layer and the one or more component layers form parallel planes, the plurality of second conduction paths of the circuit component are oriented to avoid eddy currents in the second conduction paths caused by the electric current through the coil structure, at least some of the plurality of second conduction paths define a second area, and the coil structure is located within the defined second area and within the defined first area.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 4A is a schematic diagram illustrating an example PMOS transistor connected as a buffer capacitor that may be implemented on an integrated circuit.

FIG. 4B is a conceptual diagram illustrating a view of an example PMOS transistor connected as a buffer capacitor with a single metal connection layer.

FIG. 4C is a conceptual diagram illustrating a view of an example PMOS transistor connected as a buffer capacitor with multiple metal connection layers.

DETAILED DESCRIPTION

The disclosure describes techniques to implement active or passive circuitry under inductive circuitry such that conduction paths of the circuitry under the inductive circuitry, e.g., a coil, follows the shape of a patterned shield. Placing a patterned shield under the coil structure, such that the strips of the shield cross at right angles to the conductors in the coil structure may shield the electric field and avoid eddy currents in the conductive paths of the shield layer. Such a patterned shield does not prevent the magnetic field from penetrating past the patterned shield so placing other circuitry below the patterned shield may still result in magnetic coupling to the circuitry. The patterned shield has been shown to improve the Q factor of the inductive circuitry.

In some examples, the active or passive circuitry of this disclosure may act as the patterned shield. In other examples, the active or passive circuitry may comprise one or more conduction layers co-located with a patterned shield and the circuitry may have the same or similar shape to the patterned shield. For an IC, the active or passive circuitry arranged as a shield may be near the coil structure, which may make space available on the IC to add additional circuitry, or to reduce the size of the die. Examples of circuitry may include transistors, capacitors, or similar circuit components. In other words, moving circuitry during the IC design process to be located in the same area as a coil, where such circuitry would be subject to the magnetic field from the coil, may leave room on the IC available for other circuit components.

Figure 1:
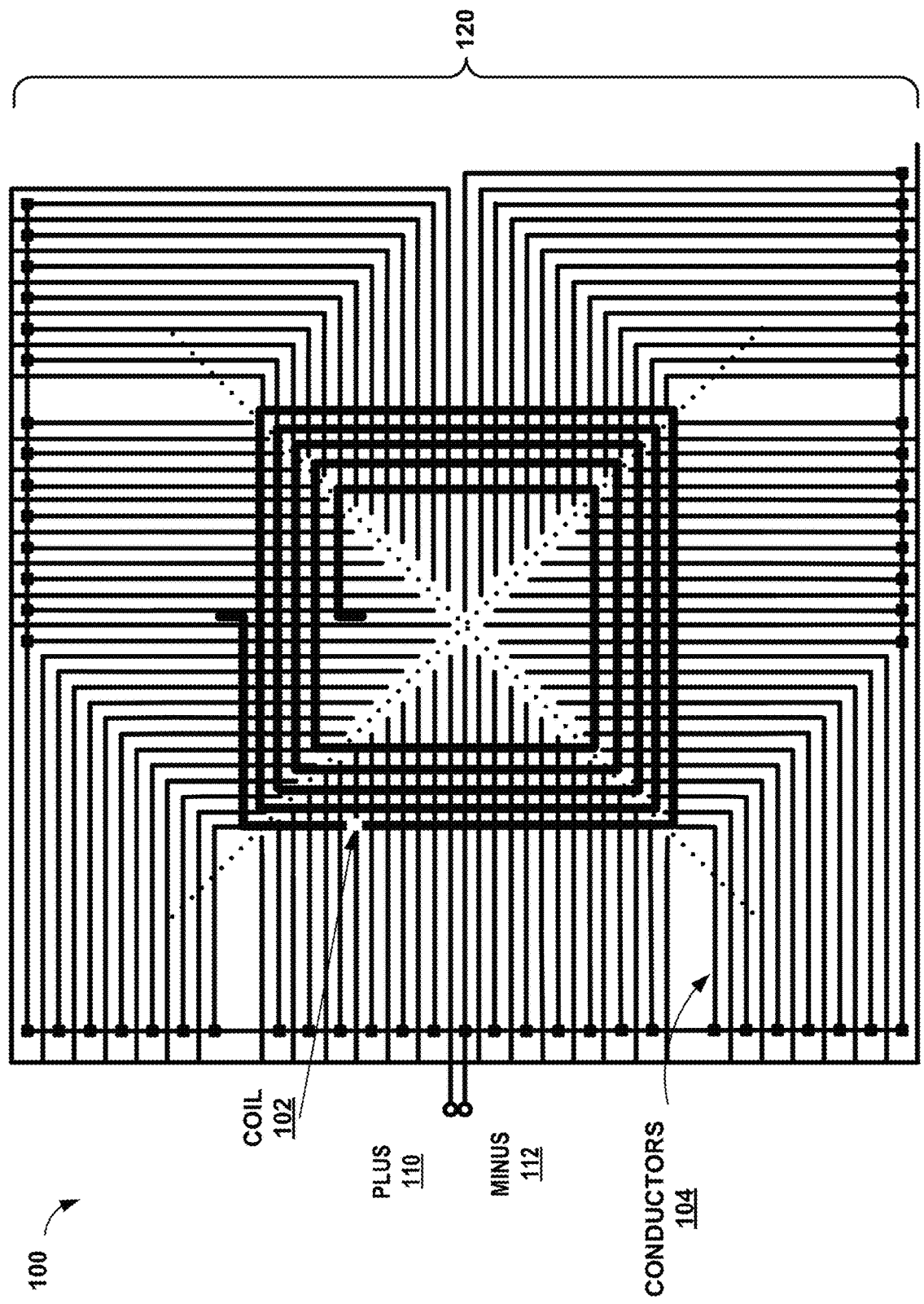
FIG. 1 is a conceptual diagram illustrating a coil structure shielded by a circuit component according to one or more techniques of this disclosure.

FIG. 1 is a conceptual diagram illustrating a coil structure shielded by a circuit component according to one or more techniques of this disclosure. The example of system 100 in FIG. 1 illustrates a portion of a circuit, such as a printed circuit board (PCB), printed wire board (PWB), integrated circuit (IC) or similar structure that includes coil 102 and a pattern shield formed by conductors 104. Conductors 104 may be implemented by metal layers, doped silicon, conductive adhesive or some other conductive material. Conductors 104 may also be referred to as conduction paths, conductive paths, and traces, but the terms may be used interchangeably in this disclosure.

In the example of FIG. 1, the circuitry that includes coil 102 may function as an inductor, part of a transformer, or some similar inductive circuitry component. In this disclosure an active or passive circuit component, e.g., transistor, inductor, capacitor, resistor, and similar components, may also be referred to as a circuit element, a device, or as circuitry. In some examples, coil 102 may be a coil structure located on a layer of an IC, PCB, or similar circuit structure that defines a plane. Coil 102 may electrically connect to other circuitry (not shown in FIG. 1).

Conductors 104 may define conduction paths located on one or more other layers separate from coil 102, and electrically isolated from coil 102. The layers with conductors 104 may comprise parallel planes, that are also parallel to the plane of coil 102. In the example of FIG. 1, conductors 104 may form an active or passive circuit component, such as one or more transistors, capacitors, or similar components, in addition to functioning as a patterned shield for coil 102. As shown in the example of FIG. 1, conductors 104 of the circuit component defines an area 120 and coil 102 is located with area 120. The circuit component formed by conductors 104 may connect to other portions of system 100 (not shown in FIG. 1) by terminals plus 110 and minus 112.

In the example of FIG. 1, the conduction paths of the circuit component formed by conductors 104 are oriented to avoid eddy currents in the conduction paths caused by an electric current through the coil structure of coil 102. That is, where conductors 104 overlap coil 102, conductors 104 are perpendicular to the conductive paths of coil 102. In the example of FIG. 1, coil 102 is implemented as a rectangular coil. In other examples, coil 102 may be implemented as a circular coil, oval coil, octagonal coil or some other shape. For some examples of coil shapes, conductors 104 may be oriented from perpendicular, to approximately perpendicular, at each location where a conductor of conductors 104 crosses a conductor of coil 102. In other words, conductors 104 may cross the conductors of coil 102 within a few degrees of 90 degrees, such as 90 degrees±five degrees. In other examples of coil shapes, conductors 104 may be oriented to cross the conductors of coil 102 between 45 degrees to 90 degrees and still avoid eddy currents in conductors 104.

Figure 2A:
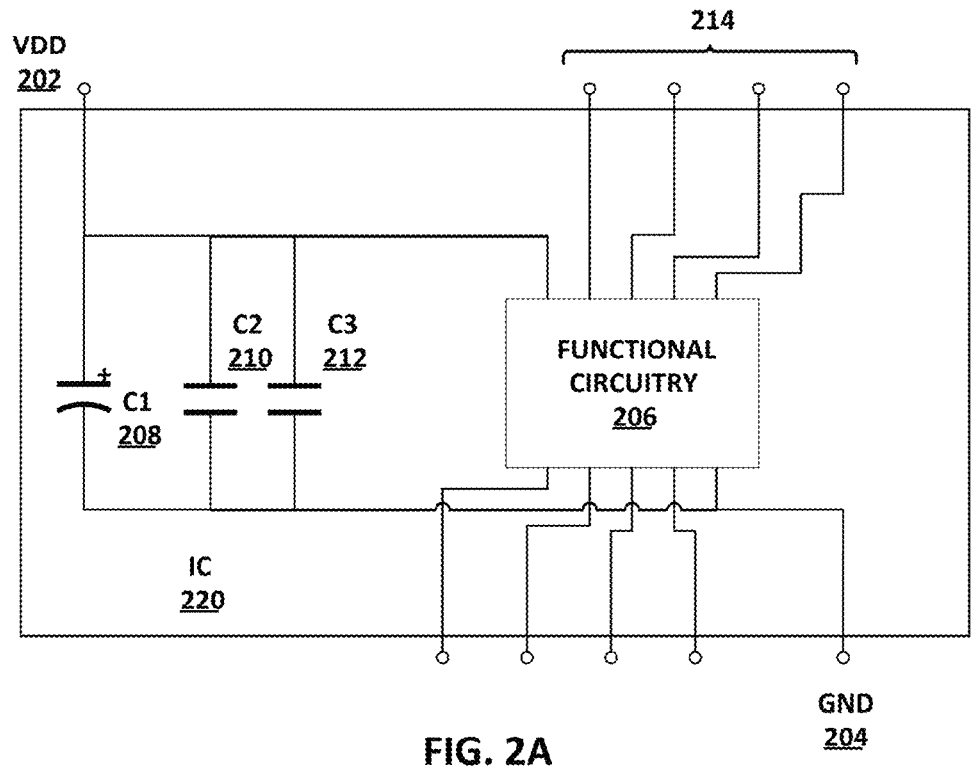
FIG. 2A is a schematic diagram illustrating an example integrated circuit including buffer capacitors.

FIG. 2A is a schematic diagram illustrating an example integrated circuit (IC) 220 including buffer capacitors. IC 220 may include functional circuitry 206, configured to perform any of one or more circuit operation. For example, functional circuitry 206 may include processing circuitry, a memory, amplifiers, filters, capacitors, transformers, inductors and other circuit components. IC 220 may comprise terminals to connect to other circuitry (not shown in FIG. 2A), such as terminals 214, power supply terminal Vdd 202, and ground terminal 204. In some examples ground terminal 204 may connect to circuit ground. In other examples, ground terminal 204 may connect to another power supply rail, such as a Vss power supply (not shown in FIG. 2A.

The circuitry of IC 220 may also include one or more capacitors arranged as buffer capacitors, e.g., capacitor C1 208, C2 210, C3 212. As described above, a buffer capacitor may be connected between power supply rails for ripple suppression, to stabilize power supplied to the IC, or for other reasons. In some examples, C1 208 may define a larger capacitance than C2 210 and C3 212. Capacitors with smaller capacitance may help reduce ripple on a power supply rail, e.g., Vdd 202, while a larger value capacitor may stabilize power by storing electrical energy to provide temporary power to IC 220 if the voltage on Vdd 202 momentarily drops.

Figure 2B:
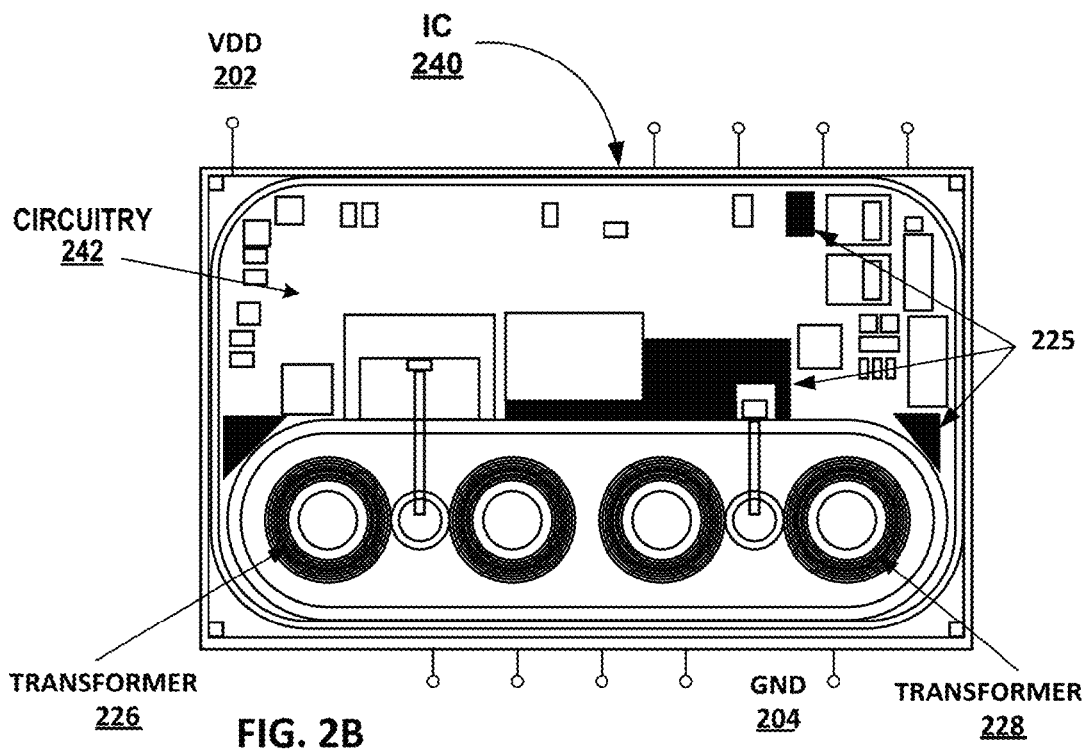
FIG. 2B is a conceptual diagram illustrating an example integrated circuit with an on-chip coil structure.

FIG. 2B is a conceptual diagram illustrating an example integrated circuit with an on-chip coil structure. IC 240 is an example of IC 220 described above in relation to FIG. 2A. As with IC 220, circuitry 242 of IC 240 may include functional circuitry configured to perform any of one or more circuit operation. Circuitry 242 may include one or more buffer capacitors, which may consume a significant volume of the IC, e.g., as shown by the areas indicated by 225. IC 240 may also include one or more coil structures, such as transformer 226 and transformer 228.

As described above, in some examples, IC 240 may include a patterned shield (not shown in FIG. 2B) located below the inductive circuitry of transformers 226 and 228.

Placing a patterned shield under the coil structure, such that the conductive strips of the shield cross at right angles to the conductors in the coil structure may shield the electric field and avoid eddy currents in the conductors of the shield. Such a patterned shield, however, may not prevent the magnetic field from penetrating past the patterned shield.

Figure 3C:
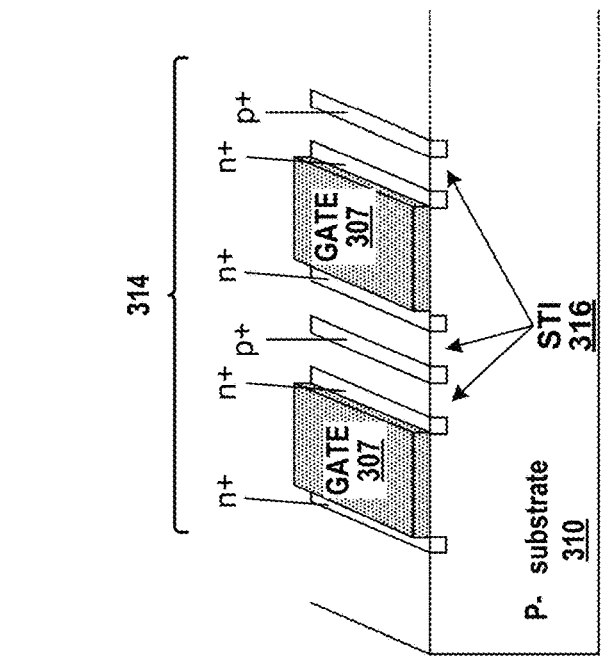
FIG. 3C is a conceptual diagram illustrating an example NMOS transistor structure of an integrated circuit.
Figure 3A:
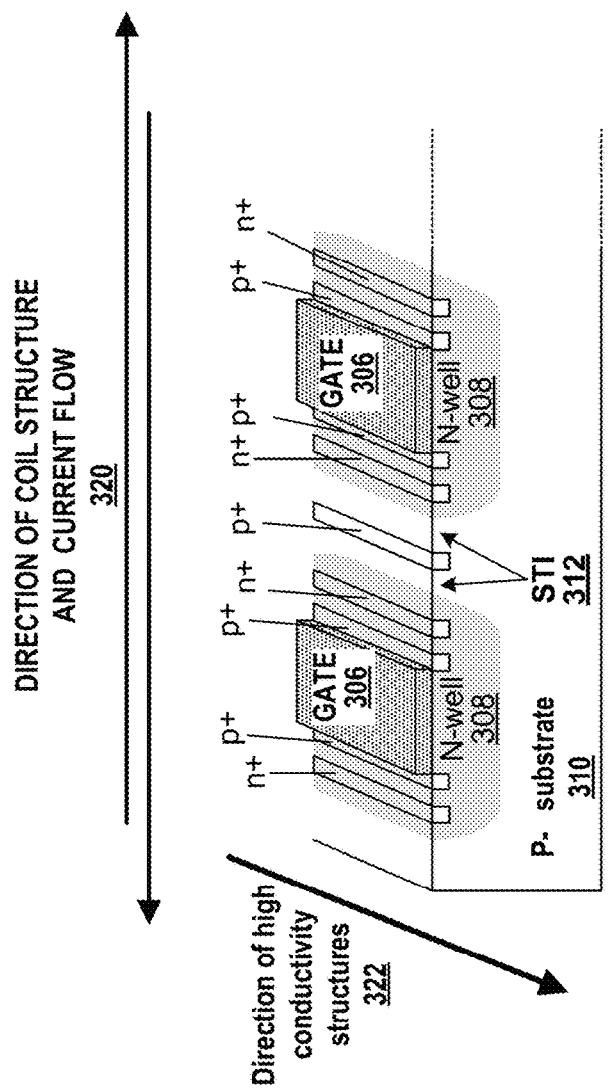
FIG. 3A is a conceptual diagram illustrating an example PMOS transistor structure of an integrated circuit.

FIG. 3A is a conceptual diagram illustrating an example PMOS transistor structure of an integrated circuit. The example of FIG. 3A depicts the direction of high conductivity structures 322 running approximately perpendicular to the direction of conductors for coil structure 320, and current flowing in the coil structure. The direction of the coil structure 320 of FIG. 3A is an example of the arrangement of coil 102 described above in relation to FIG. 1. The direction of high conductivity structures 322 is an example of the arrangement of conductors 104 of FIG. 1.

The high conductivity structures of FIG. 3A may be placed in a p− substrate 310 along with more highly doped regions, e.g., with high conductivity and low resistivity, such as N-well 308 and one or more p+ and n+ regions, which may act as source, drain or other functions. The PMOS device of FIG. 3A may also include shallow trench isolation, STI 312, between one or more conductive structures. Gate 306 may be implemented by low resistivity poly-silicon (poly-Si), in some examples. The conductive structures of FIG. 3A may also include one or more metal layers (not shown in FIG. 3A).

Figure 3D:
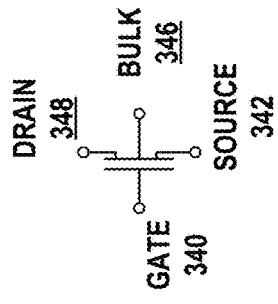
FIG. 3D is a schematic diagram illustrating an example NMOS transistor that may be implemented on an integrated circuit.
Figure 3B:
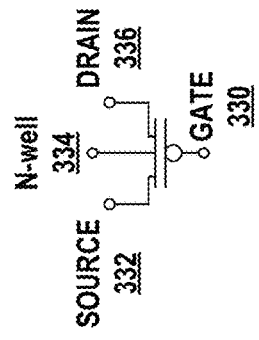
FIG. 3B is a schematic diagram illustrating an example PMOS transistor that may be implemented on an integrated circuit.

FIG. 3B is a schematic diagram illustrating an example PMOS transistor that may be implemented on an integrated circuit. The schematic of FIG. 3B is an example of a transistor structure described above in relation to FIG. 3A. The transistor of FIG. 3B includes terminals for gate 330, source 332, N-well 334, which corresponds to N-well 308 of FIG. 3A, and a terminal for drain 336.

FIG. 3C is a conceptual diagram illustrating an example NMOS transistor structure of an integrated circuit. Similar to FIG. 3A, the p− substrate 310 may include high conductivity structures running approximately perpendicular to the direction of coil structure 320. The high conductivity structures 314 may include one or more p+ and n+ regions, which may act as source, or drain, along with a gate 307 implemented by low resistivity poly-silicon (poly-Si), in some examples. The NMOS structure of FIG. 3C may also include STI 316.

FIG. 3D is a schematic diagram illustrating an example NMOS transistor that may be implemented on an integrated circuit. The schematic of FIG. 3D is an example of a transistor structure described above in relation to FIG. 3C. The transistor of FIG. 3D includes terminals for gate 340, source 342, bulk 346, which corresponds to the p− substrate 310 of FIG. 3C, and a terminal for drain 348.

FIG. 4A is a schematic diagram illustrating an example PMOS transistor connected as a buffer capacitor that may be implemented on an integrated circuit. Connecting the source, drain, and N-well of a PMOS transistor at a first terminal with the gate as a second terminal may cause the transistor to function as a capacitor. The arrangement of FIG. 4A is an example of any of capacitors C1 208, C2 210 and C3 212, described above in relation to FIG. 2A. The structures that form the PMOS transistor of FIG. 4A may be arranged such that the conduction paths of the PMOS transistor circuit component comprise the conductors of the patterned shield for a coil, such as conductors 104 described above in relation to FIG. 1.

FIG. 4B is a conceptual diagram illustrating a view of an example PMOS transistor connected as a buffer capacitor with a single metal connection layer. As described above in relation to FIG. 3A, the example of FIG. 4B depicts PMOS transistors in which high conductivity structures that implement the PMOS transistors may run approximately perpendicular to the direction of conductors for a coil structure (not shown in FIG. 4B) as well as electrical current flowing in the conductors of the coil structure. In this manner the high conductivity structures, e.g., n+ paths 414, gate 406, N-well 408, and the p+ paths that form source 402 and drain 404, may form the structure of a patterned shield for inductive circuitry, e.g., coil 102 of FIG. 1 and transformers 226 and 228 of FIG. 2B.

As shown in the example of FIG. 4B, source 402 and drain 404 may connect to N-well 408 via n+ paths 414, and connect to a power supply rail, such as Vdd, with metal layer M1 402. Similarly, gate 406 may connect to ground at metal layer M1 402. In this manner, the PMOS transistor of FIG. 4B may form a buffer capacitor based on capacitance between N-well 408 and gate 406, as well as the capacitance 420 between N-well 408 and p− substrate 410. The example of FIG. 4B also includes shallow trench isolation, STI 412, between some of the conductive structures. In some examples, the arrangement of FIG. 4B may be referred to as a MOS-capacitor and is an example of the arrangement described above in relation to FIG. 4A.

FIG. 4C is a conceptual diagram illustrating a view of an example PMOS transistor connected as a buffer capacitor with multiple metal connection layers. The example shown in FIG. 4C is an example that is consistent with the arrangement described above in relation to FIGS. 4A and 4B, as well as FIGS. 3A and 3B. In other examples, the capacitor of FIGS. 4A-4C may connect to other locations in a circuit, different from between Vdd and ground, and therefore perform other circuit functions, e.g., in an oscillator, filter circuit and other similar functions.

As with the PMOS transistor described above in relation to FIG. 4B, the transistors of FIG. 4C also includes high conductivity structures, e.g., n+ paths 414, gate 406, N-well 408 and the p+ paths that form source 402 and drain 404, that may form the structure of a patterned shield. The example of FIG. 4C also includes shallow trench isolation, STI 412, between some of the conductive structures. As described above in relation to FIG. 1, the patterned shield may reduce the electric field caused by inductive circuitry but may not reduce the magnetic field.

Similar to the example of FIG. 4B, metal layer M1 in FIG. 4C, which may occupy a layer on a parallel plane to the high conductivity structures, may electrically connect the transistors to form a capacitor, as described above in relation to FIG. 4A. In addition, other metal layers 440, e.g., M2, M3, and M4, may also be located on layers parallel to metal layer M1 and also provide an electrical connection between the terminals of the transistors of FIG. 4B. The multiple metal layers may electrically connect source 402 and drain 404 to N-well 408 via n+ paths 414. The metal layers may also connect to a power supply rail, such as Vdd with metal layer M1 402. Similarly, gate 406 may connect to ground through metal layers 440.

The conduction paths of metal layers 440 may be oriented to avoid eddy currents in the conduction paths caused by an electric current through a nearby coil structure, as described above in relation to FIG. 1 for conduction paths 104. In other words, the conductions paths for the high conductivity layers of the transistors of FIG. 4B, as well as the conduction paths for metal layers 440 may be oriented perpendicular, or approximately perpendicular, to the electric current through the coil structure. In the example of coil shapes that are not square or rectangular, the angle between the conduction paths and the direction of current flow in the coil structure may be between 45 degrees and 90 degrees.

In some examples, metal layers 440 may further include one or more additional metal layers, e.g., M5 in the example of FIG. 4C, which may form a patterned shield located on a layer separate from the layers for the component, e.g., the transistors and metal layers M1-M4. The conductors of layer M5 may be electrically isolate from M1-M4 in some examples. Though the example of FIG. 4C shows four electrically connected metal layers M1-M4, in other examples, a circuit component with conduction paths that also form a patterned shield may include any number of layers. Also, in other examples, metal layers M1-M5 may be implemented as doped silicon, or any other type of conductive path.

Figure 5:
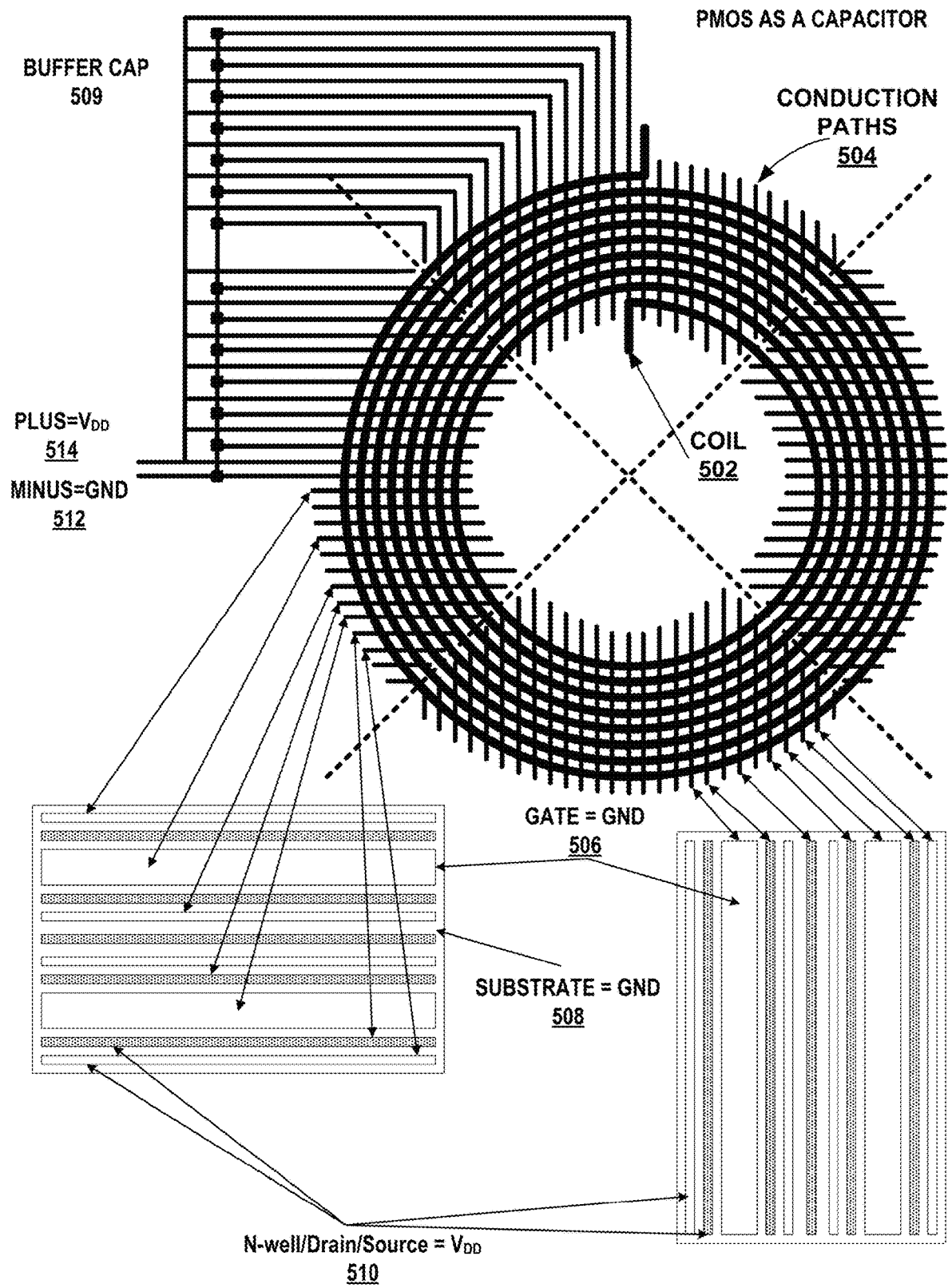
FIG. 5 is a conceptual diagram illustrating a coil structure shielded by a circuit component connected to the circuit along one side, according to one or more techniques of this disclosure.

FIG. 5 is a conceptual diagram illustrating a coil structure shielded by a circuit component configured connect along one side to other circuitry, according to one or more techniques of this disclosure. The circuitry of FIG. 5 is an example of the coil and shield structure described above in relation to FIGS. 1, 3A-3D and 4A-4B. Conduction paths 504 in the example of FIG. 5 form buffer capacitor 509, which may connect to other portions of a circuit (not shown in FIG. 5), such as Vdd 514 and circuit ground 512. In some examples, conduction paths 504 may be configured as a PMOS transistor with the source, drain and N-well connected to form buffer capacitor 509, as described above in relation to FIGS. 4A-4C.

The conductive paths of buffer capacitor 509, e.g., gate 506, as well as N-well, source and drain paths 510, are oriented to avoid eddy currents in the conductive paths caused by an electric current through coil structure 502. In some examples, the conduction paths 504 of buffer capacitor 509 are oriented perpendicular, or approximately perpendicular, to the electric current through coil structure 502. Because coil 502 is a circular shaped coil, in some examples, conductive paths 504 may be oriented as much as forty-five degrees to the conductors of coil 502 in the example of FIG. 5 at each location where a conductive path of buffer capacitor 509 crosses coil 502. In other locations, such as the interconnections to other parts of a circuit, e.g., to Vdd 514, conduction paths 504 may be oriented as needed to meet spacing and other parameters for the circuitry. In some examples, circular shaped coils, such as coil 502, may be used in higher voltage applications than rectangular shaped coils, such as coil 102 of FIG. 1.

In some examples, the circuitry of FIG. 5 may be implemented on an integrated circuit. Coil 502 may be located on at least a first layer of the IC. In some examples, coil 502 may be located on multiple parallel layers of the IC. Buffer capacitor 509 may include conduction paths located on one or more parallel layers separate from and electrically isolated from the layers of coil 502. In other words, the layers for the circuit device, buffer capacitor 509, and the layers for coil 502 may define parallel planes.

As described above in relation to FIGS. 4B and 4C, buffer capacitor 509 may include one or more layers, e.g., metal layers, that electrically connect different portions of buffer capacitor 509. For example, substrate 508 that on which the conductive paths are located may connect to a circuit ground, along with the different conductive paths that form gate 506. Other conductive paths, e.g., N-well, drain and source 510 may connect to Vdd, as described above in relation to FIG. 4A, to form buffer capacitor 509, which also acts as a patterned shield.

In some examples, the circuit device depicted by FIG. 5 may also include a separate patterned shield, located above, below or between the other layers, as described above in relation to FIG. 4C (not shown in FIG. 5). The separate patterned shield may also define an area, which may be larger, smaller or the same as the area defined by conduction paths 504 of buffer capacitor 509. In the example of FIG. 5, the area defined by the buffer capacitor 509 does not include the area in the center of coil 502, in contrast to the example of FIG. 1. Coil 502 may be located within the area defined by buffer capacitor 509, as well as any additional patterned shield, to reduce the electrical field emissions caused by electrical current through coil 502. The patterned shield formed by buffer capacitor 509 may also improve the performance of coil 502, e.g., improve the Q-factor.

Figure 6A:
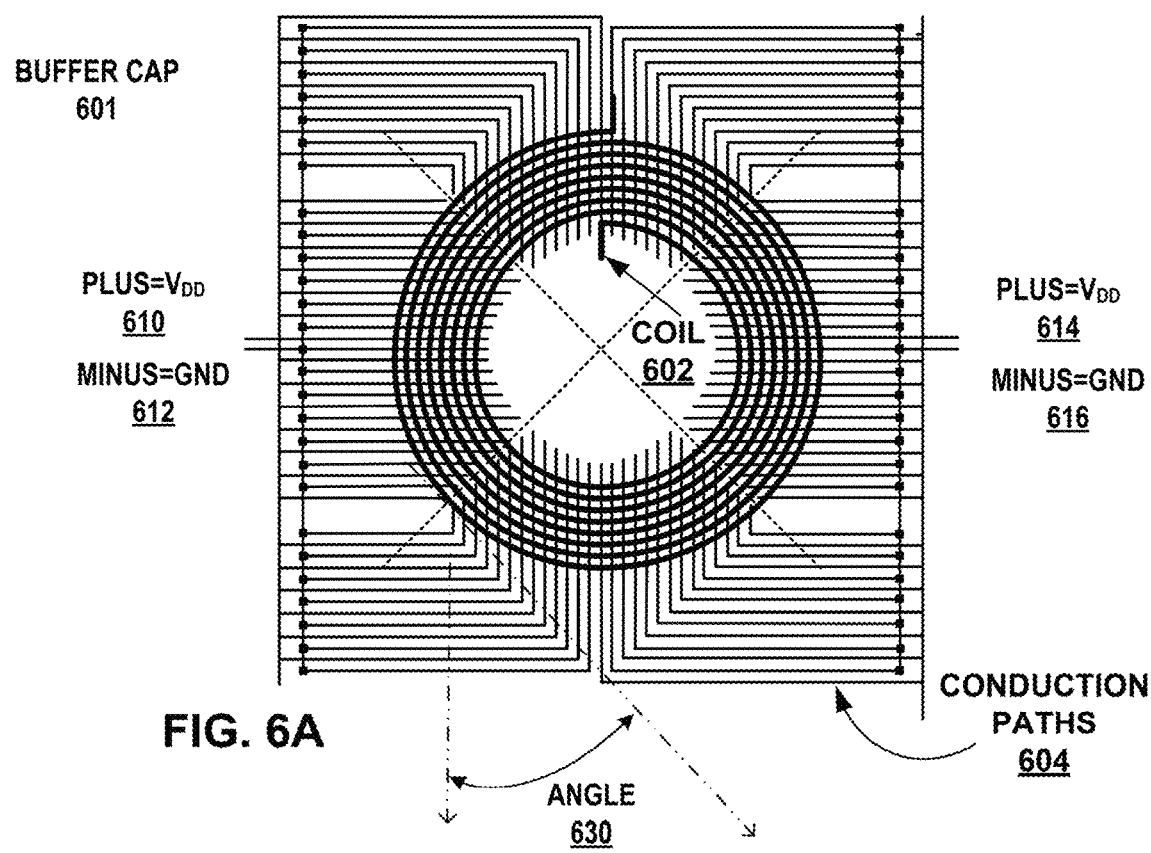
FIG. 6A is a conceptual diagram illustrating a coil structure shielded by a circuit component connected to the circuit along multiple sides, according to one or more techniques of this disclosure.

FIG. 6A is a conceptual diagram illustrating a coil structure shielded by a circuit component connected to the circuit along multiple sides, according to one or more techniques of this disclosure. The circuitry of FIG. 6A is an example of the coil and shield structure described above in relation to FIGS. 1, 3A-3D, 4A-4B and 5 and may have the same or similar characteristics. Conduction paths 604 in the example of FIG. 6A form buffer capacitor 601 connected to Vdd 610 and circuit ground 612 on one side of the circuit component and to Vdd 614 and ground 616 on an opposite side. Coil 602 is located within the area defined by buffer capacitor 601. As described above in relation to FIG. 5, the pattern shield area of buffer capacitor 601 does not include the center portion of coil 602. In the example of FIG. 6A, conduction paths 604 may be oriented to cross the conductors of coil 602 at angle 630, which may be between 45 degrees to 90 degrees to avoid eddy currents in conduction paths 604.

Figure 6B:
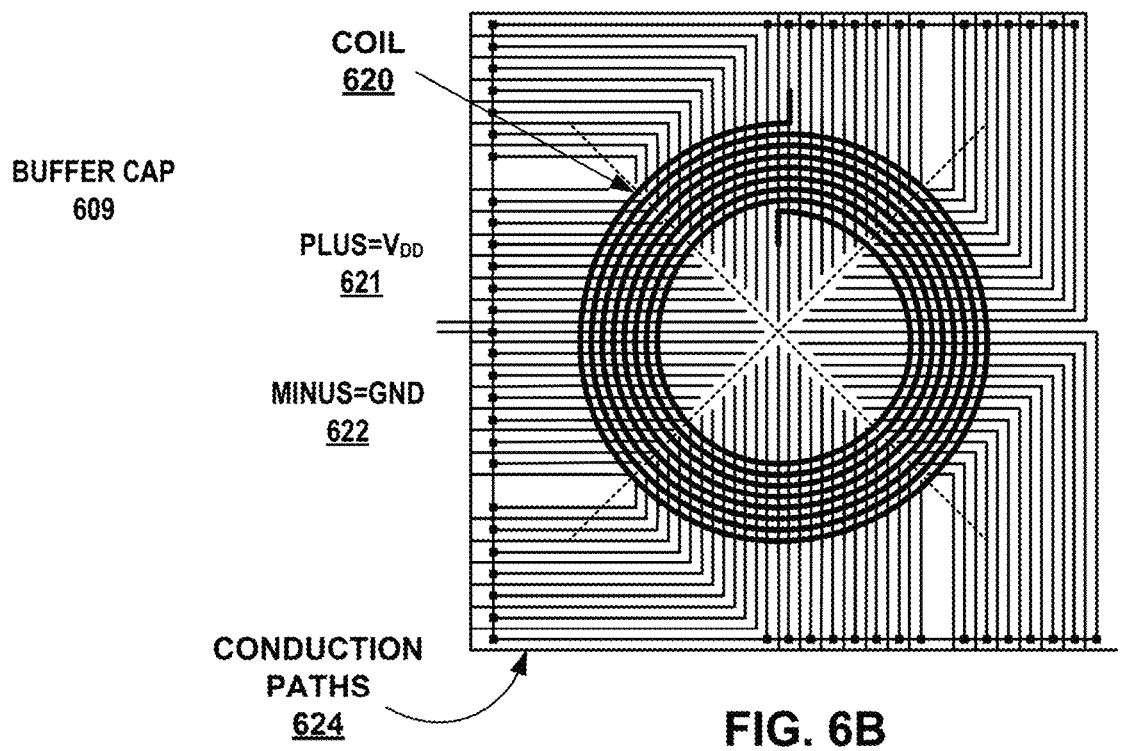
FIG. 6B is a conceptual diagram illustrating a coil structure shielded by a circuit component including the coil center, according to one or more techniques of this disclosure.

FIG. 6B is a conceptual diagram illustrating a coil structure shielded by a circuit component including the coil center, according to one or more techniques of this disclosure. The circuitry of FIG. 6B is an example of the coil and shield structure described above in relation to FIGS. 1, 3A-3D, 4A-4B, 5 and 6A and may have the same or similar characteristics. Unlike the example of FIG. 6A, conduction paths 624 in the example of FIG. 6A form buffer capacitor 609 connected to Vdd 621 and circuit ground 622 on only one side of the circuit component. Also, similar to the example of FIG. 1, the pattern shield area of buffer capacitor 609 includes the center portion of coil 620.

Figure 7:
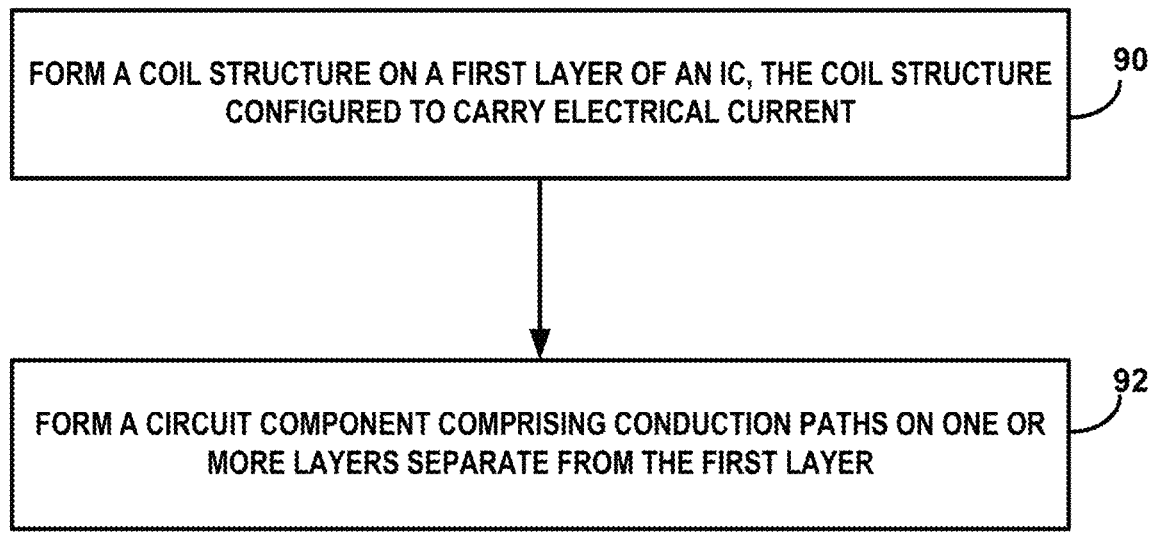
FIG. 7 is a flow chart illustrating example fabrication steps for the integrated circuit of this disclosure.

FIG. 7 is a flow chart illustrating example fabrication steps for the integrated circuit of this disclosure. The blocks of FIG. 7 will be described in terms of FIGS. 1, 3A and 4C unless otherwise noted. The steps listed in FIG. 7 are just one example order for fabricating an IC of this disclosure. In other examples, the steps of FIG. 7 may be performed in a different order than listed, and may include more or fewer steps than described for FIG. 7.

To fabricate an IC of this disclosure, a circuit fabrication system, e.g., an IC foundry, may be configured to form a coil structure on a first layer, or set of layers of the IC (90). The coil structure, e.g., coil 102 may be inductive circuitry configured to carry electrical current, such as an inductor, transformer 226, as described above in relation to FIG. 2B, or similar inductive circuitry that may generate an electromagnetic field.

The circuit fabrication system may form a circuit component that includes conduction paths on one or more layers separate from the layers of the coil structure (92). As described above in relation to FIGS. 1 and 4B, the layers for the coil structure and the one or more layers for the circuit component may define parallel planes. The conduction paths of the circuit component, e.g., the transistors of FIG. 3A may be oriented to avoid eddy currents in the conduction paths caused by an electric current through the coil structure. In some examples, the direction of high conductivity structures, e.g., gate 306, N-well 308, conduction paths on any metal layers and similar conduction paths for the circuit component, may run approximately perpendicular to the direction of the conductors for coil structure 320, and of electrical current flowing in the coil structure conductors. As described above in relation to FIGS. 1, 5, 6A and 6B, at least some of the conduction paths for the circuit component define an area, and the coil structure is located within the defined area.

The techniques of this disclosure may also be described in the following examples.

Example 1: A circuit comprising a coil structure located on at least a first layer of an integrated circuit (IC); and a circuit component comprising conduction paths, wherein the conduction paths are located on one or more layers separate from the first layer, the first layer and the one or more layers form parallel planes, the conduction paths of the circuit component are oriented to avoid eddy currents in the conduction paths caused by an electric current through the coil structure, at least some of the conduction paths define an area, and the coil structure is located within the defined area.

Example 2: The circuit of example 1, wherein the conduction paths of the circuit component are oriented approximately perpendicular to the electric current through the coil structure.

Example 3: The circuit of any of examples 1 and 2, wherein the area is a first area, the circuit further comprising the first layer and the second layer form parallel planes, the patterned shield comprises a plurality of conductors oriented to avoid eddy currents caused by the electric current through the coil structure, the plurality of conductors defines a second area, and the coil structure is located within the defined second area.

Example 4: The circuit of example 3, wherein the conduction paths of the circuit component comprise the plurality of conductors of the patterned shield.

Example 5: The circuit of any of examples 1 through 4, wherein the coil structure is located on two or more layers of the integrated circuit, and wherein the two or more layers of the coil structure are separate from the one or more layers of the circuit component.

Example 6: The circuit of any of examples 1 through 5, wherein the circuit component comprises a transistor.

Example 7: The circuit of any of examples 1 through 6, wherein the circuit component comprises a capacitor.

Example 8: The circuit of any of examples 1 through 7, wherein the coil structure comprises a transformer.

Example 9: The circuit of any of examples 1 through 8, wherein the coil structure comprises an inductor.

Example 10: A method comprising forming a coil structure on a first layer of an integrated circuit (IC), wherein the coil structure is configured to carry electrical current; forming a circuit component comprising conduction paths on one or more layers separate from the first layer, wherein: the first layer and the one or more layers form parallel planes, the conduction paths of the circuit component are oriented to avoid eddy currents in the conduction paths caused by an electric current through the coil structure, at least some of the conduction paths define an area, and the coil structure is located within the defined area.

Example 11: The method of example 10, wherein the conduction paths of the circuit component are oriented approximately perpendicular to the electric current through the coil structure.

Example 12: The method of any of examples 10 and 11, wherein the area is a first area, the IC further comprising the first layer and the second layer form parallel planes, the patterned shield comprises a plurality of conductors oriented to avoid eddy currents caused by the electric current through the coil structure, a plurality of conductors defines a second area, and the coil structure is located within the defined second area.

Example 13: The method of any of examples 10 through 12, wherein the circuit component comprises a transistor.

Example 14: The method of any of examples 10 through 13, wherein the coil structure comprises a transformer.

Example 15: A circuit comprising a coil structure located on at least a first layer of an integrated circuit (IC); a patterned shield located on a second layer separate from the first layer, wherein the first layer and the second layer form parallel planes, the patterned shield comprises a plurality of first conduction paths oriented to avoid eddy currents caused by electric current through the coil structure, the plurality of first conduction paths defines a first area, and a circuit component comprising a plurality of second conduction paths, wherein: the plurality of second conduction paths are located on one or more component layers separate from the first layer and separate from the second layer and are electrically isolated from the patterned shield, the first layer, the second layer and the one or more component layers form parallel planes, the plurality of second conduction paths of the circuit component are oriented to avoid eddy currents in the second conduction paths caused by the electric current through the coil structure, at least some of the plurality of second conduction paths define a second area, and the coil structure is located within the defined second area and within the defined first area.

Example 16: The circuit of example 15, wherein the second conduction paths of the circuit component are oriented approximately perpendicular to the electric current through the coil structure at each location where a conduction path of the plurality of second conduction paths crosses the coil structure.

Example 17: The circuit of any of examples 15 and 16, wherein the coil structure is located on two or more layers of the integrated circuit and the two or more layers comprise the first layer, and wherein the two or more layers of the coil structure are separate from the one or more layers of the circuit component.

Example 18: The circuit of any of examples 15 through 17, wherein the circuit component comprises a transistor.

Example 19: The circuit of any of examples 15 through 18, wherein the circuit component comprises a capacitor.

Example 20: The circuit of any of examples 15 through 19, wherein the coil structure comprises an inductor.

Various examples of the disclosure have been described. These and other examples are within the scope of the following claims.

What is claimed is:
1. A circuit comprising:
  a coil structure located on at least a first layer of an integrated circuit (IC); and
  a circuit component comprising conduction paths, wherein:
    the conduction paths are located on one or more layers separate from the first layer,
    the first layer and the one or more layers form parallel planes,
    the conduction paths of the circuit component are oriented to avoid eddy currents in the conduction paths caused by an electric current through the coil structure, at least some of the conduction paths define an area, and the coil structure is located within the defined area.

2. The circuit of claim 1, wherein the conduction paths of the circuit component are oriented approximately perpendicular to the electric current through the coil structure.

3. The circuit of claim 1, wherein the area is a first area, the circuit further comprising a patterned shield located on a second layer separate from the first layer, wherein:

the first layer and the second layer form parallel planes, the patterned shield comprises a plurality of conductors oriented to avoid eddy currents caused by the electric current through the coil structure, the plurality of conductors defines a second area, and the coil structure is located within the defined second area.

4. The circuit of claim 3, wherein the conduction paths of the circuit component comprise the plurality of conductors of the patterned shield.

5. The circuit of claim 1, wherein the coil structure is located on two or more layers of the integrated circuit, and wherein the two or more layers of the coil structure are separate from the one or more layers of the circuit component.

6. The circuit of claim 1, wherein the circuit component comprises a transistor.

7. The circuit of claim 1, wherein the circuit component comprises a capacitor.

8. The circuit of claim 1, wherein the coil structure comprises a transformer.

9. The circuit of claim 1, wherein the coil structure comprises an inductor.

10. A circuit comprising:

a coil structure located on at least a first layer of an integrated circuit (IC);

a patterned shield located on a second layer separate from the first layer, wherein:

the first layer and the second layer form parallel planes, the patterned shield comprises a plurality of first conduction paths oriented to avoid eddy currents caused by electric current through the coil structure, the plurality of first conduction paths defines a first area, and a circuit component comprising a plurality of second conduction paths, wherein:

the plurality of second conduction paths is located on one or more component layers separate from the first layer and separate from the second layer and are electrically isolated from the patterned shield, the first layer, the second layer and the one or more component layers form parallel planes, the plurality of second conduction paths of the circuit component is oriented to avoid eddy currents in the second conduction paths caused by the electric current through the coil structure, at least some of the plurality of second conduction paths define a second area, and the coil structure is located within the defined second area and within the defined first area.

11. The circuit of claim 10, wherein the second conduction paths of the circuit component are oriented approximately perpendicular to the electric current through the coil structure at each location where a conduction path of the plurality of second conduction paths crosses the coil structure.

12. The circuit of claim 10, wherein the coil structure is located on two or more layers of the integrated circuit and the two or more layers comprise the first layer, and wherein the two or more layers of the coil structure are separate from the one or more layers of the circuit component.

13. The circuit of claim 10, wherein the circuit component comprises a transistor.

14. The circuit of claim 10, wherein the circuit component comprises a capacitor.

15. The circuit of claim 10, wherein the coil structure comprises an inductor.

* * * * *